United States Patent
Lin

(10) Patent No.: US 8,253,475 B2
(45) Date of Patent: Aug. 28, 2012

(54) FUSE DETECTING APPARATUS

(75) Inventor: Che-Min Lin, Taipei County (TW)

(73) Assignee: Winbond Electronics Corp., Taichung (TW)

( * ) Notice: Subject to any disclaimer, the term of this patent is extended or adjusted under 35 U.S.C. 154(b) by 46 days.

(21) Appl. No.: 12/901,450

(22) Filed: Oct. 8, 2010

(65) Prior Publication Data

US 2012/0086500 A1 Apr. 12, 2012

(51) Int. Cl.
  *H03K 17/18* (2006.01)
  *H03K 19/003* (2006.01)
  *H01H 37/76* (2006.01)
(52) U.S. Cl. ........................................................ 327/525
(58) Field of Classification Search ................... 327/525
  See application file for complete search history.

(56) References Cited

U.S. PATENT DOCUMENTS

| 6,281,739 B1 * | 8/2001 | Matsui | 327/525 |
| 7,395,475 B2 * | 7/2008 | Do | 714/734 |
| 7,514,982 B2 * | 4/2009 | Warner | 327/525 |
| 7,567,449 B2 * | 7/2009 | Paak et al. | 365/96 |

* cited by examiner

*Primary Examiner* — Lincoln Donovan
*Assistant Examiner* — Terry L Englund
(74) *Attorney, Agent, or Firm* — J.C. Patents

(57) ABSTRACT

A fuse detecting apparatus includes a detector, a calibrator and a logical operating unit. The detector includes a detecting switch module and a detecting latch. The detecting switch module generates an initial detecting result according to first and second control signals and a status of the fuse. The detecting latch stores a voltage level of the initial detecting result or maintains its originally stored voltage level according to the initial detecting result for generating a pre-calibrating detecting signal. The calibrator includes a calibrating switch module and a calibrating latch. The calibrating switch module generates a calibrating result according to the first and second control signals. The calibrating latch stores the calibrating result and generates a calibrating signal accordingly. The logical operating unit generates a calibrated detecting signal according to the pre-calibrating detecting signal and the calibrating signal.

13 Claims, 6 Drawing Sheets

FUSE DETECTING APPARATUS

BACKGROUND

1. Field of the Invention

The invention relates to a fuse detecting apparatus.

2. Description of Related Art

In a present integrated circuit, a so-called "fusing" technique is generally used to achieve effects of selecting functions or adjusting an output voltage level. In brief, one or a plurality of fuses is blown to form open circuits or is not blown to form short circuits to generate more than one combinations, so as to set functions to be selected or output voltage levels to be generated. Once determining of a fuse status goes wrong, an operation of the whole integrated circuit is incorrect, which may cause an irredeemable error.

Referring to FIG. 1, FIG. 1 is a diagram illustrating a conventional fuse detecting apparatus. The fuse detecting apparatus 100 includes transistors P1 and N1 serving as switches, transistors P2, P3, N2 and N3 used for constructing a latch, and an inverter INV1. The fuse detecting apparatus 100 is used for detecting a short circuit state or an open circuit state of a fuse FUSE. Operation details of the fuse detecting apparatus 100 are described with reference of FIG. 2, and FIG. 2 is a signal waveform diagram of the fuse detecting apparatus 100. First, a reference voltage VINT serving as a power voltage that is received by the fuse detecting apparatus 100 is enabled and gradually increases to a stable state. Meanwhile, a control signal bFPUP is enabled (maintained to a logic low level) to turn on the transistor P1. Now, the latch formed by the transistors P2, P3, N2 and N3 latches a received signal (logic high level) equivalent to the reference voltage VINT, and outputs a detecting signal bFLATS with the logic low level through the inverter INV1. Then, the control signal bFPUP is transited to the logic high level (which is disabled) to turn off the transistor P1, and another control signal FPUN is enabled (transited to the logic high level) to turn on the transistor N1. In case that the fuse is not blown (the short circuit state), the latch formed by the transistors P2, P3, N2 and N3 latches a ground voltage VSS to transit the detecting signal bFLATS into a logic high level signal.

It should be noticed that although the fuse in the fuse detecting apparatus has the short circuit state, during a time period T1, the detecting signal bFLATS used for representing the status of the fuse FUSE presents an open circuit state (logic level) which represents that the fuse FUSE is blown down. Namely, the conventional fuse detecting apparatus 100 is liable to generate misjudgement.

SUMMARY

The invention is directed to a fuse detecting apparatus, which can effectively reduce a possibility of misjudgement of a fuse state.

The invention provides a fuse detecting apparatus including a detector, a calibrator and a logical operating unit. The detector includes a detecting switch module and a detecting latch. The detecting switch module is coupled between a first reference voltage and a fuse in serial, and is used for receiving a first and a second control signals, and generating an initial detecting result according to the first and the second control signals and a short state or an open state of the fuse. Wherein, the fuse is coupled between the detecting switch module and a second reference voltage. The detecting latch is coupled to the detecting switch module for receiving the initial detecting result, and stores a voltage level of the initial detecting result or maintains its originally stored voltage level according to the initial detecting result, and the detecting latch generates a pre-calibrating detecting signal according to its stored voltage level. The calibrator includes a calibrating switch module and a calibrating latch. The calibrating switch module is coupled between the first reference voltage and the second reference voltage, and receives the first and the second control signals, and generates a calibrating result according to the first and second control signals. The calibrating latch is coupled to the calibrating switch module and receives the calibrating result, and outputs a calibrating signal according to an inverse of the calibrating result. The logical operating unit is coupled to the detector and the calibrator, and performs a logical operation according to the pre-calibrating detecting signal and the calibrating signal, so as to generate a calibrated detecting signal.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
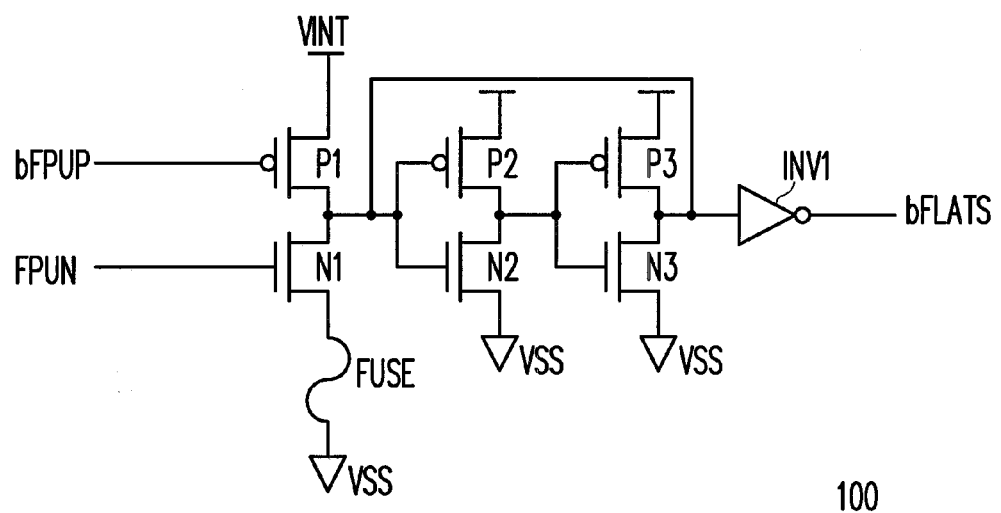
FIG. 1 is a diagram illustrating a conventional fuse detecting apparatus 100.
Figure 2:
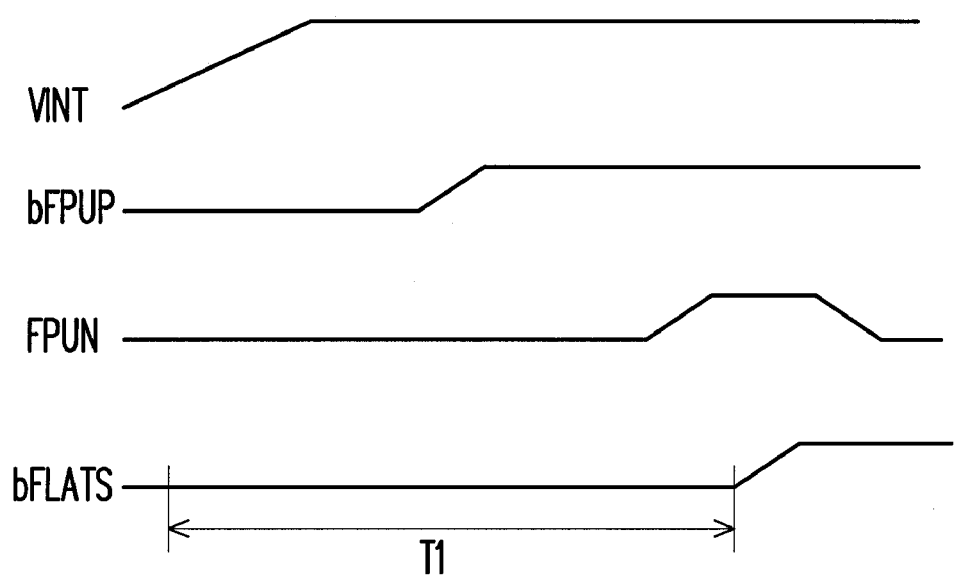
FIG. 2 is a signal waveform diagram of a fuse detecting apparatus 100.
Figure 3:
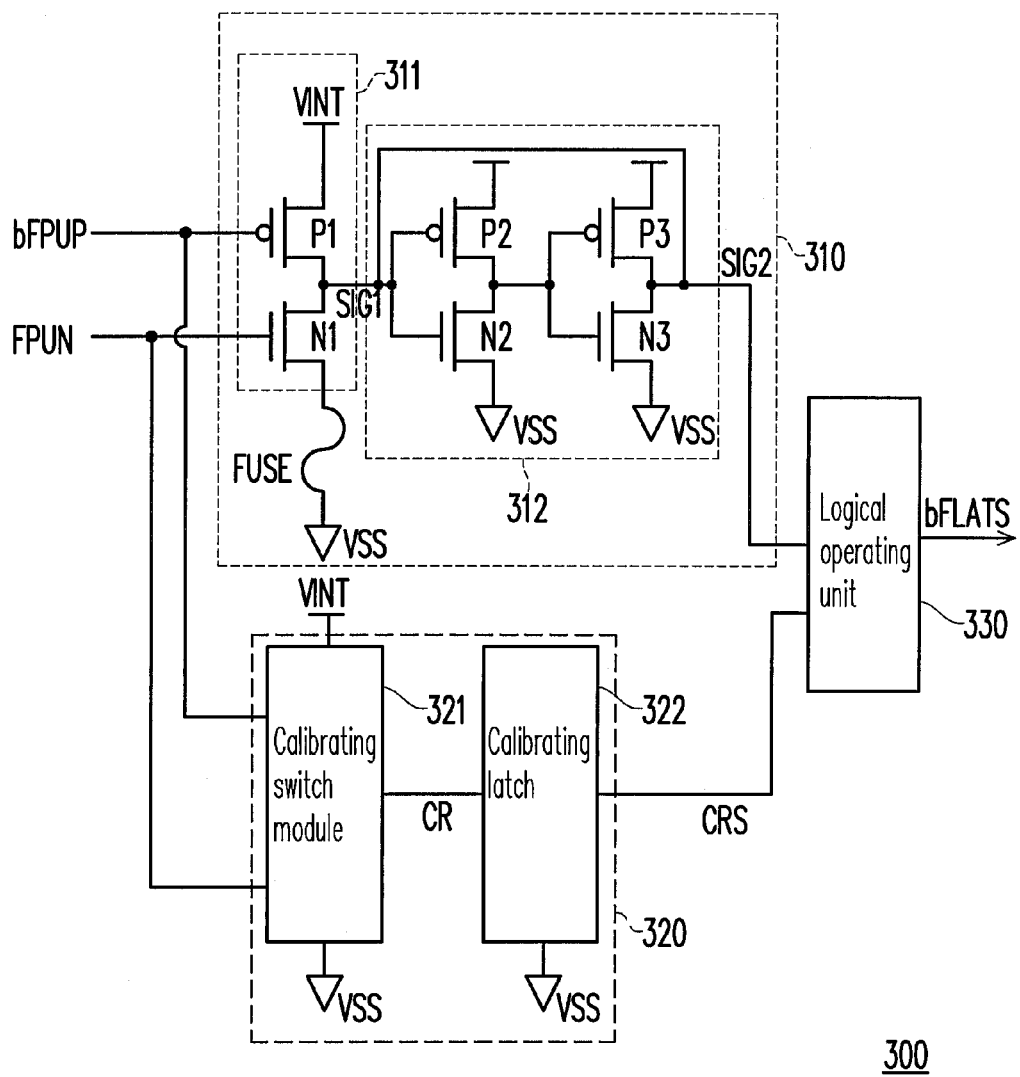
FIG. 3 is a schematic diagram illustrating a fuse detecting apparatus 300 according to an embodiment of the invention.

FIG. 3 is a schematic diagram illustrating a fuse detecting apparatus 300 according to an embodiment of the invention. The fuse detecting apparatus 300 includes a detector 310, a calibrator 320 and a logical operating unit 330. The detector 310 includes a detecting switch module 311 and a detecting latch 312.

The detecting switch module 311 is coupled in serial between a reference voltage VINT and a fuse FUSE, and receives a control signal bFPUP and a control signal FPUN. The detecting switch module 311 generates an initial detecting result SIG1 according to the control signals bFPUP and FPUN and a short state or an open state of the fuse FUSE. Wherein, the fuse FUSE is coupled between the detecting switch module 311 and a reference voltage VSS. In the present embodiment, the detecting switch module 311 is implemented by detecting switches respectively formed by transistors P1 and N1, wherein the detecting switch formed by the transistor P1 is coupled to the reference voltage VINT and is controlled by the control signal bFPUP. The detecting switch formed by the transistor N1 is coupled in serial between the fuse FUSE and the transistor P1, and is controlled by the control signal FPUN.

Moreover, the detecting latch 312 is coupled to the detecting switch module 311, and receives the initial detecting result SIG1. The detecting latch 312 stores a voltage level of the initial detecting result SIG1 or maintains its originally stored voltage level according to the initial detecting result SIG1. The detecting latch 312 generates a pre-calibrating detecting signal SIG2 according to its stored voltage level. It should be noticed that when the transistor P1 in the detecting switch module 311 is turned on in response to the control signal bFPUP, the transistor N1 has to be turned off. Meanwhile, the initial detecting result SIG1 and the reference voltage VINT may have the same voltage level. Comparatively, when the transistor N1 is turned on in response to the control signal FPUN, the transistor P1 has to be turned off. Now, if the fuse FUSE has the short state, the initial detecting result SIG1 and the reference voltage VSS have the same voltage level. Alternatively, if the fuse FUSE has the open state, the initial detecting result SIG1 presents a state of high impedance. If the initial detecting result SIG1 received by the detecting latch 312 is equal to the reference voltage VSS or the reference voltage VINT, the detecting latch 312 latches the corresponding voltage level of the initial detecting result SIG1. If the initial detecting result SIG1 presents a state of high impedance, the detecting latch 312 maintains its originally stored voltage level.

In the present embodiment, the detecting latch 312 includes a buffer formed by two serially connected inverters consisting of transistors P2, N2, P3 and N3, wherein an output terminal of the buffer is connected to an input terminal thereof, and the output terminal outputs the pre-calibrating detecting signal SIG2. It should be noticed that it is only an example that the buffer is formed by two inverters, and the invention is not limited to the situation that the buffer in the detecting latch 312 has to be formed by two inverters.

The calibrator 320 includes a calibrating switch module 321 and a calibrating latch 322. The calibrating switch module 321 is coupled in serial between the reference voltage VINT and the reference voltage VSS. The calibrating switch module 321 receives the control signals bFPUP and FPUN, and generates a calibrating result CR according to the control signals bFPUP and FPUN. The calibrating latch 322 is coupled to the calibrating switch module 321 and receives the calibrating result CR. The calibrating latch 322 stores the calibrating result CR and outputs a calibrating signal CRS according to an inversion of the calibrating result CR. Wherein, a voltage level of the calibrating result CR generated by the calibrating switch module 321 according to the control signals bFPUP and FPUN is equal to one of the reference voltages VINT and VSS. In brief, when the control signal bFPUP is enabled, the voltage level of the calibrating result CR is equal to the reference voltage VINT. Comparatively, when the control signal FPUN is enabled, the voltage level of the calibrating result CR is equal to the reference voltage VSS.

The logical operating unit 330 is coupled to the detector 310 and the calibrator 320. The logical operating unit 330 performs a logical operation according to the pre-calibrating detecting signal SIG2 and the calibrating signal CRS, so as to generate a calibrated detecting signal bFLATS.

Figure 4:
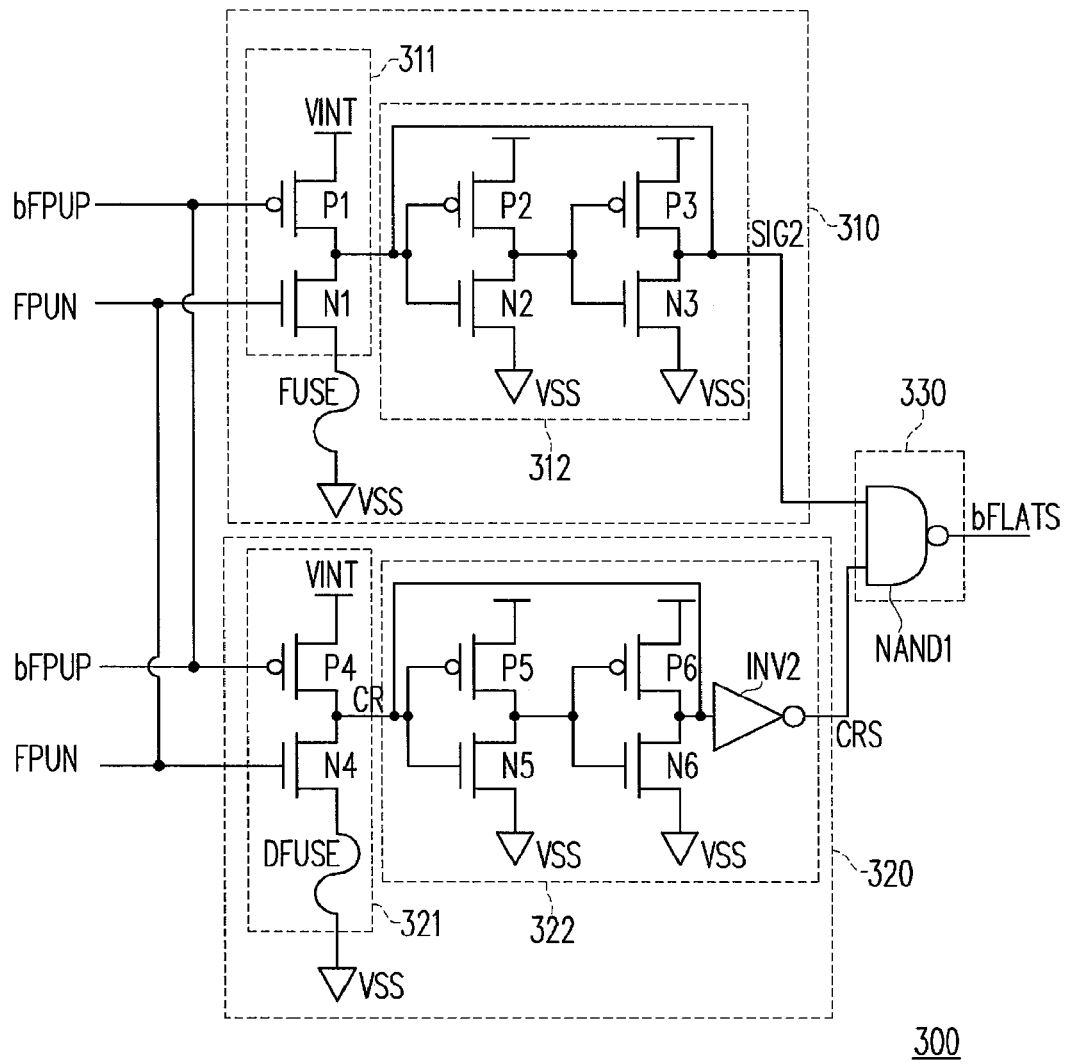
FIG. 4 is a diagram illustrating an example of a fuse detecting apparatus 300 according to an embodiment of the invention.

Referring to FIG. 4, FIG. 4 is a diagram illustrating an example of the fuse detecting apparatus 300 according to an embodiment of the invention. The calibrating switch module 321 includes calibrating switches respectively formed by transistors P4 and N4. One end of the transistor P4 is coupled to the reference voltage VINT, and another end thereof generates the calibrating result CR, and the transistor P4 is controlled by the control signal bFPUP. The transistor N4 is coupled in serial between the transistor P4 and the reference voltage VSS, and is controlled by the control signal FPUN. Moreover, a calibrating fuse DFUSE is coupled, between the transistor N4 and the reference voltage VSS.

The calibrating latch 322 includes a buffer formed by a plurality of serially connected inverters consisting of transistors P5, N5, P6 and N6. An output terminal of the buffer is connected to an input terminal thereof, and the output terminal is coupled to an inverter INV2. The calibrating latch 322 receives and latches the calibrating result CR, and outputs the calibrating signal CRS inverted to the calibrating result CR through an output terminal of the inverter INV2.

The logical operating unit 330 is an NAND gate NAND1. Two input terminals of the NAND gate NAND1 respectively receive the calibrating signal CRS and the pre-calibrating detecting signal SIG2, and an output terminal thereof outputs the calibrated detecting signal bFLATS.

Figure 5:
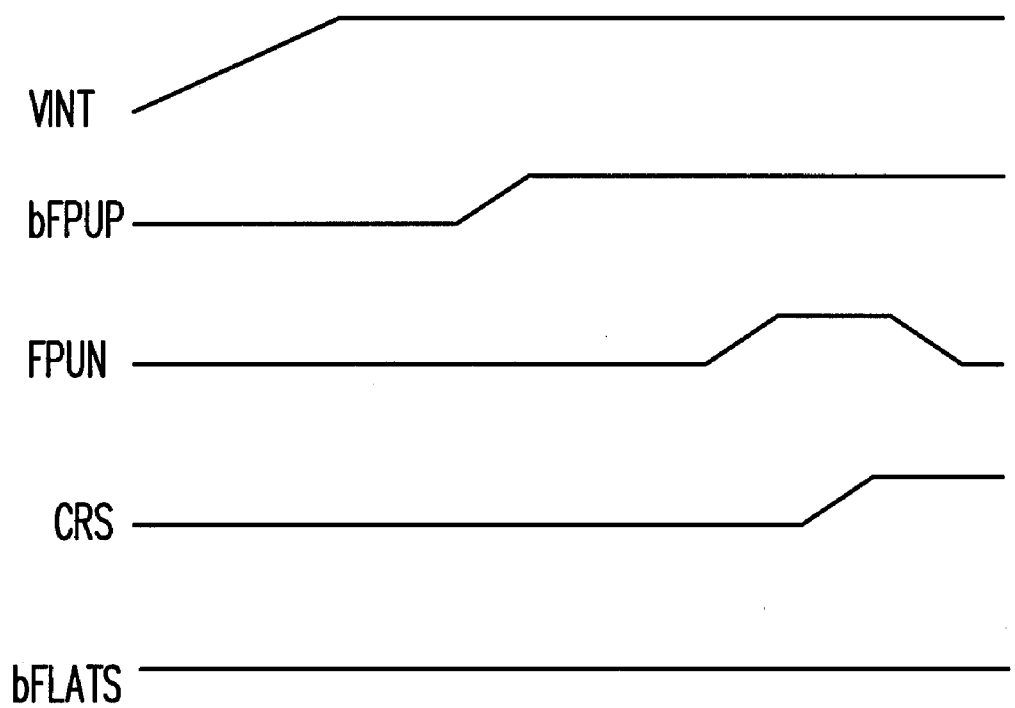
FIG. 5 is a signal waveform diagram of a fuse detecting apparatus 300 of FIG. 4.

In view of a whole operation of the fuse detecting apparatus 100, referring to FIG. 4 and FIG. 5, and FIG. 5 is a signal waveform diagram of the fuse detecting apparatus 300. While the reference voltage VINT serving as a power voltage is enabled and gradually increases to a stable state, the control signal bFPUP is maintained to a logic low level to turn on the transistors P1 and P4, so that the calibrating result CR and the pre-calibrating detecting signal SIG2 all have a logic high level (equal to a voltage level of the reference voltage VINT). Now, the calibrating signal CRS has a logic low level inversed to the logic level of the calibrating result CR. Moreover, since the calibrating signal CRS has the logic low level, the logical operating unit 330 implemented by the NAND gate NAND1 correspondingly generates the calibrated detecting signal bFLATS with the logic high level.

Then, after the control signal bFPUP is transited to the logic high level, the control signal FPUN is correspondingly transited to the logic high level to turn on the transistors N1 and N4. Since the calibrating fuse DFUSE is permanently maintained to the short state, the calibrating result CR is equal to the reference voltage VSS and has the logic low level, so that the calibrating signal CRS accordingly has the logic high level. The logical operating unit 330 implemented by the NAND gate NAND1 correspondingly maintains the calibrated detecting signal bFLATS with the logic high level.

According to the above descriptions with reference of FIG. 5, in the present embodiment, regardless of the logic levels of the control signals bFPUP and FPUN, a situation of generating a calibrated detecting signal bFLATS with the logic low level that probably causes misjudgement is avoided. Namely, the fuse detecting apparatus 300 may effectively resolve the misjudgement problem of the conventional fuse detecting apparatus.

It should be noticed that since the calibrating fuse DFUSE is permanently maintained to the short state, it can also be omitted. Namely, the transistor N4 can be directly connected to the reference voltage VSS.

Moreover, though the logical operating unit 330 of FIG. 4 is implemented by the NAND gate NAND1, the NAND gate NAND1 can also be replaced by a logic circuit of an AND gate. Certainly, in case that the logical operating unit 330 is implemented by the AND gate, a meaning of the state of the fuse FUSE that is represented by the logic level of the calibrated detecting signal bFLATS is reversed to a meaning of the fuse state that is represented by the logic level of the calibrated detecting signal bFLATS generated by the logical operating unit 330 formed by the NAND gate NAND1.

Moreover, it should be noticed that a time point for the calibrator 320 receiving the control signals bFPUP and FPUN is earlier than a time point for the detector 310 receiving the control signals bFPUP and FPUN, so as to ensure that a time point for generating the calibrating signal CRS is effectively earlier than that of the pre-calibrating detecting signal SIG2, so as to shield a part of the pre-calibrating detecting signal SIG2 that probably has an error.

Figure 6:
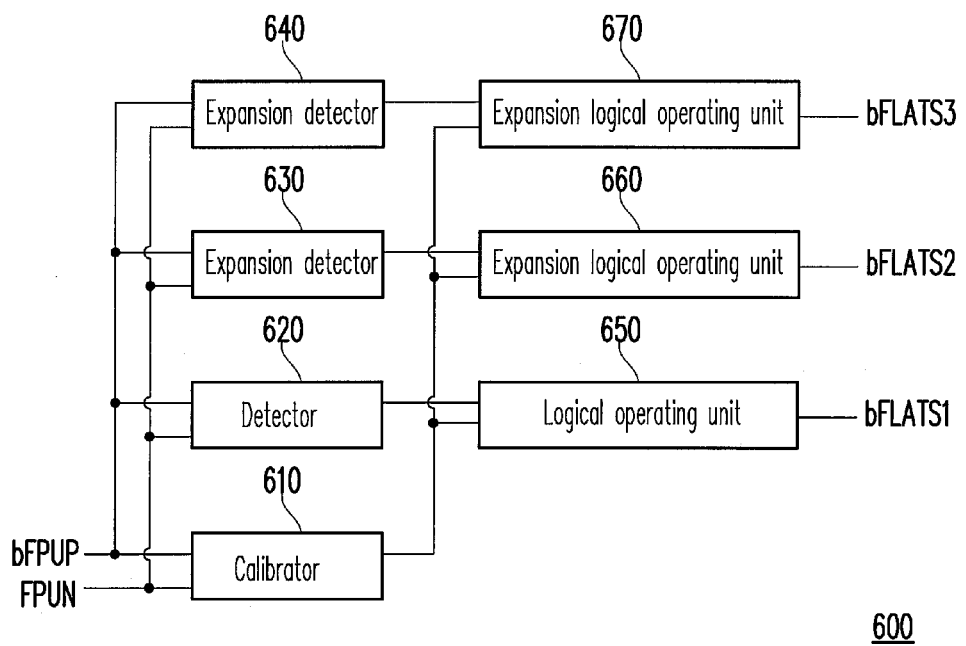
FIG. 6 is a schematic diagram of a fuse detecting apparatus 600 according to another embodiment of the invention.

Referring to FIG. 6, FIG. 6 is a schematic diagram of a fuse detecting apparatus 600 according to another embodiment of the invention. Besides a detector 620, a calibrator 610 and a logical operating unit 650, the fuse detecting apparatus 600 further includes a plurality of expansion detectors 630-640 and a plurality of expansion logical operating units 660-670. Here, numbers of the expansion detectors and the expansion logical operating units have to be identical (which are equal to N, and N is an integer). Moreover, internal circuits of the expansion detectors 630-640 are the same to the internal circuit of the detector 620, and internal circuits of the expansion logical operating units 660-670 are the same to the internal circuit of the logical operating unit 650.

In the present embodiment, by using the detector 620 and the expansion detectors 630-640 in collaboration with the same calibrator 610, the logical operating unit 650 and the expansion logical operating units 660-670 may perform logical operations to obtain a plurality of calibrated detecting signals bFLTS1-bFLTS3, so as to obtain short states or open states of a plurality of fuses. It should be noted that a time point for the calibrator 610 receiving the control signals bFPUP and FPUN is earlier than a time point for the detector 620 and the expansion detectors 630-640 receiving the control signals bFPUP and FPUN.

In summary, in the invention, the calibrator is used to provide the calibrating signal, so as to shield a part of the pre-calibrating detecting signal that probably has an error through the logical operating unit. Moreover, the calibrating signal is generated within the fuse detecting apparatus, so that influences of the other signals can be effectively avoided.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A fuse detecting apparatus, comprising:
   a detector, comprising:
   a detecting switch module, coupled between a first reference voltage and a fuse, for receiving first and second control signals and generating an initial detecting result according to the first and second control signals and a short state or an open state of the fuse, wherein the fuse is coupled between the detecting switch module and a second reference voltage; and
   a detecting latch, coupled to the detecting switch module, for receiving the initial detecting result, and storing a voltage level of the initial detecting result or maintaining its originally stored voltage level according to the initial detecting result, wherein the detecting latch generates a pre-calibrating detecting signal according to its stored voltage level;
   a calibrator, comprising:
   a calibrating switch module, coupled between the first reference voltage and second reference voltage, for receiving the first and second control signals, and generating a calibrating result according to the first and second control signals; and
   a calibrating latch, coupled to the calibrating switch module, for receiving and storing the calibrating result, and outputting a calibrating signal according to an inversion of the calibrating result; and
   a logical operating unit, coupled to the detector and the calibrator, for performing a logical operation according to the pre-calibrating detecting signal and the calibrating signal, so as to generate a calibrated detecting signal.

2. The fuse detecting apparatus as claimed in claim 1, wherein when the first control signal is enabled and the second control signal is disabled, the initial detecting result of the detecting switch module is equal to the first reference voltage, when the second control signal is enabled, the first control signal is disabled and the fuse is in the short state, the initial detecting result is equal to the second reference voltage, and when the second control signal is enabled, the first control signal is disabled and the fuse is in the open state, the initial detecting result is equal to the pre-calibrating detecting signal.

3. The fuse detecting apparatus as claimed in claim 2, wherein when the initial detecting result is equal to the first or the second reference voltage, the detecting latch correspondingly stores the first or the second reference voltage.

4. The fuse detecting apparatus as claimed in claim 1, wherein when the first control signal is enabled and the second control signal is disabled, the calibrating signal is equal to the first reference voltage, and when the second control signal is enabled and the first control signal is disabled, the calibrating signal is equal to the second reference voltage.

5. The fuse detecting apparatus as claimed in claim 1, wherein the calibrating switch module comprises:
   a first calibrating switch, having one end coupled to the first reference voltage, and another end generating the calibrating result, and the first calibrating switch being controlled by the first control signal;
   a second calibrating switch, coupled between the other end of the first calibrating switch and the second reference voltage, and the second calibrating switch being controlled by the second control signal; and
   a calibrating fuse, coupled between the second calibrating switch and the second reference voltage, wherein the calibrating fuse is maintained in the short state.

6. The fuse detecting apparatus as claimed in claim 1, wherein the calibrating latch comprises:
   a buffer, having an output terminal and an input terminal, the output terminal being coupled to the input terminal of the buffer, and the input terminal of the buffer being coupled to the calibrating switch module for receiving the calibrating result; and
   an inverter, having an input terminal coupled to the output terminal of the buffer, and an output terminal generating the calibrating signal.

7. The fuse detecting apparatus as claimed in claim 1, wherein the logical operating unit is AND gate or NAND gate.

8. The fuse detecting apparatus as claimed in claim 1, further comprising:
   N expansion detectors, wherein N is a positive integer, and each of the expansion detectors comprises:
   an expansion detecting switch module, coupled between the first reference voltage and an expansion fuse, for receiving the first control signal and second control signal, and generating an expansion initial detecting result according to the first and second control signals and the short state or the open state of the expansion fuse, wherein the expansion fuse is coupled between an expansion detecting switch module and the second reference voltage; and an expansion detecting latch, coupled to the expansion detecting switch module, for receiving the expansion initial detecting result, and storing a voltage level of the expansion initial detecting result or maintaining its originally stored voltage level according to the expansion initial detecting result, the expansion detecting latch generating an expansion pre-calibrating detecting signal according to the voltage level stored by the expansion detecting latch; and N expansion logical operating units, respectively coupled to the expansion detectors and the calibrator, the expansion logical operating units respectively receiving the expansion pre-calibrating detecting signals and the calibrating signal for generating expansion calibrated detecting signals.

9. The fuse detecting apparatus as claimed in claim 8, wherein when the first control signal is enabled and the second control signal is disabled, the expansion initial detecting result of each of the expansion detecting switch modules is equal to the first reference voltage, when the second control signal is enabled, the first control signal is disabled and the expansion fuse is in the short state, the expansion initial detecting result is equal to the second reference voltage, and when the second control signal is enabled, the first control signal is disabled and the expansion fuse is in the open state, the expansion initial detecting result is equal to the expansion pre-calibrating detecting signal.

10. The fuse detecting apparatus as claimed in claim 9, wherein when the expansion initial detecting result is equal to the first or second reference voltage, the expansion detecting latch correspondingly stores the first or second reference voltage.

11. The fuse detecting apparatus as claimed in claim 8, wherein each of the expansion detecting switch modules comprises:
a first expansion detecting switch, having one end coupled to the first reference voltage, and another end generating the expansion initial detecting result, the first expansion detecting switch being controlled by the first control signal; and
a second expansion detecting switch, having one end coupled to the other end of the first expansion detecting switch, and the second expansion detecting switch being controlled by the second control signal,
wherein the expansion fuse is coupled between another end of the second expansion detecting switch and the second reference voltage.

12. The fuse detecting apparatus as claimed in claim 8, wherein each of the expansion detecting latches comprises:
a buffer, having an output terminal and an input terminal, the output terminal being coupled to the input terminal, the input terminal being coupled to the expansion detecting switch module for receiving the expansion initial detecting result, and the output terminal outputting the expansion pre-calibrating detecting signal.

13. The fuse detecting apparatus as claimed in claim 8, wherein the expansion logical operating units are AND gates or NAND gates.

* * * * *